US007283926B2

United States Patent
Wu

(10) Patent No.: US 7,283,926 B2
(45) Date of Patent: Oct. 16, 2007

(54) COUNTER CIRCUITS AND DISTANCE ESTIMATION METHODS

(75) Inventor: Mau-Lin Wu, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 11/257,591

(22) Filed: Oct. 24, 2005

(65) Prior Publication Data

US 2007/0093984 A1 Apr. 26, 2007

(51) Int. Cl.
*G01C 22/00* (2006.01)
(52) U.S. Cl. ............... 702/159; 702/158; 377/19; 377/24
(58) Field of Classification Search ........ 702/158
See application file for complete search history.

(56) References Cited

U.S. PATENT DOCUMENTS 3,946,215 A * 3/1976 May .................. 708/252
5,329,467 A * 7/1994 Nagamune et al. ...... 702/159
5,724,124 A * 3/1998 Kai ..................... 356/5.01
5,748,891 A * 5/1998 Fleming et al. .......... 375/150
6,104,337 A * 8/2000 Coutts et al. ............. 342/125
7,003,665 B1 * 2/2006 Dultz et al. .............. 713/172

* cited by examiner

*Primary Examiner*—John Barlow
*Assistant Examiner*—Jonathan Moffat
(74) *Attorney, Agent, or Firm*—Winston Hsu

(57) ABSTRACT

Counting circuits applied to distance estimation for ultra wideband (UWB) application, in which a first counting unit generates a sequence of pseudo-random number series not including zero, a first recoding unit records a first series and a second series from the sequence according to a first signal and a second signal, and a transfer unit generates a binary counting value according to the first series and second series from the recording unit.

17 Claims, 6 Drawing Sheets

US 7,283,926 B2

COUNTER CIRCUITS AND DISTANCE ESTIMATION METHODS

BACKGROUND

The invention relates to counters, and more particularly, to counting circuits applied in distance estimation for ultra wideband (UWB) application.

In the ultra wideband (UWB) physical layer (PHY) specification V1.0 proposed by Multiband orthogonal frequency division multiplexing (OFDM) SIG of WiMedia, "ranging and location awareness" is included. This function is targeted to measure the distance between two UWB devices with accuracy and precision of 60 cm or better. One 32-bit ranging timer with minimum clock rate of 528 MHz is required to measure the timing difference between frame transmitting from one device and is received at another device. The maximum clock of this ranging timer is up to 4224 MHz, and is thus difficult to implement, with clock rate from 528 MHz to 4224 MHz the most critical part.

In UWB systems, the relative distance between two devices can be measured, for example, estimated by multiplying the speed of light by the measured propagation delay between the two devices. In order to support this "ranging" function, one 32-bit binary counter, ranging timer is required. Necessary clock rate is from 528 MHz to 4224 MHz with precision of 60 cm or 10 cm. With increased clock rate, precision of the ranging function improves. Conventionally, a binary counter is used to implement ranging timer, as disclosed in patents U.S. Pat. Nos. 5,682,342 and 6,690,525. Some approaches minimize the critical path of the binary counters to increase the clock rate of the counter, such as those shown in FIGS. 1A and 1B.

However, even with currently popular 0.13 um or 90 nm CMOS process, such "binary" or "Gray code" counters have difficultly meeting the speeds over 4 GHz, according to standard-cell library design flow.

SUMMARY

Embodiments of a counting circuit are disclosed, in which a first counting unit generates a sequence of pseudo-random number series not including zero, a first recording unit records a first series and a second series from the sequence according to a first signal and a second signal, and a transfer unit generates a binary counting value according to the first series and second series from the recording unit.

Embodiments of a distance measurement system are disclosed, in which a first electronic device comprises a first counting unit generating a sequence of pseudo-random number series not including zero, and a first recording unit recording a first series and a second series from the first sequence when the first electronic device transmits a ranging signal to a second electronic device and receives a replay signal therefrom respectively. A transfer unit generates a first binary counting value according to the first series and second series, and a distance between the first and the second electronic devices is estimated according to the first binary counting value and a second binary counting value.

Embodiments of a distance estimation method for an electronic device are disclosed, in which a sequence of pseudo-random number series not including zero is generated to count, and a first series is recorded from the sequence upon transmission of a ranging signal to a detected device. A second series is recorded from the sequence upon of a reply signal from the detected device, and a first binary counting value is generated according to the first series and second series. A distance between the electronic device and the detected device is estimated according to the binary counting value and a second binary counting value generated by the detected device.

DESCRIPTION OF THE DRAWINGS

The invention can be more fully understood by the subsequent detailed description and examples with reference made to the accompanying drawings, wherein.

DETAILED DESCRIPTION

Figure 2:
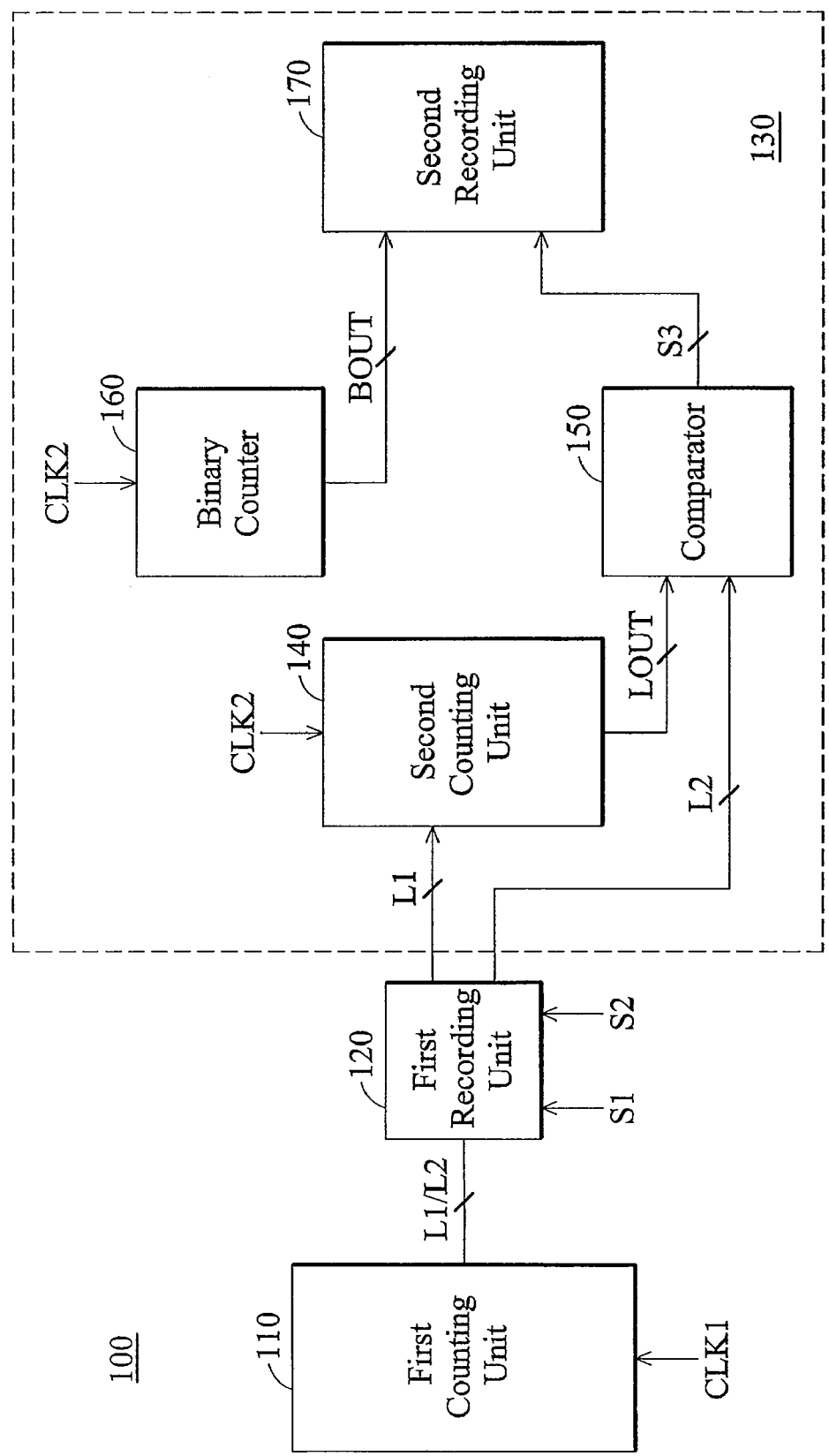
FIG. 2 shows an embodiment of a counting circuit.

The invention utilizes counting circuits with small critical path to increase clock rate, in order to obtain higher precision level. FIG. 2 shows an embodiment of a counting circuit. As shown, the counting circuit 100 comprises a first counting unit 110, a first recording unit 120 and a transfer unit 130. In this embodiment, the counting circuit 100 can be applied in an electronic device to perform ranging.

The first counting unit 110 generates a sequence of pseudo-random number series not including zero. For example, the first counting unit 110 can be a first linear feedback shift register (LFSR) counter to generate pseudo-random numbers series not including zero. In some 3-bit examples, LFSR counters can generate "001", "101", "111", "110", "011", "100", "010" and return to "001". Namely, they generate 1, 5, 7, 6, 3, 4, 2 and return to 1 in a decimal system. Typically, binary counters generate "000", "001", "010", "011", "100", "101" and "111", rather than a sequence of pseudo-random number series. Thus, LFSR counters are different from binary counters and are thus referred to as non-binary counters or maximum-length shift registers.

The first recording unit 120 records a first series L1 and a second series L2 from the sequence according to a first signal S1 and a second signal S2. The first recording unit 120, can for example, comprise a control unit and two D flip-flops, the control unit enables one D flip-flop to store the first series L1 from the series and enables the other D flip-flop to store the second series L2 from the series according to the first signal S1 and the second signal S2, such as a transmission signal and a replay signal. For example, one flip-flop can store "101" when the electronic device transmits a transmission signal, and the other D flip-flop can store "010" when the electronic device receives a reply signal.

Because the first counting unit 110 is a LFSR counter rather a binary counter, the series L1 and L2 stored in the first recording unit 120 cannot be subtracted to obtain the counting difference. Thus, the transfer unit 130 is required to generate a binary counting value according to the first series L1 and the second series L2 from the recording unit. Based on the UWB specification, this task is not required to be performed within a specific time period, and thus, it can also be implemented by software, such as C program, or hardware with lower speed, such as offline hardware.

As shown in FIG. 2, the transfer unit 130 comprises a second counting unit 140, a comparator 150, a binary counter 160 and a second recording unit 170.

The second counting unit 140 is coupled to the first recoding unit 120, counting from the first series L1 according to the sequence and outputting a current counting value LOUT to the comparator 150 simultaneously. In this embodiment, the second counting unit 140 can be a second LFSR counter identical to the first counting unit 110. For example, the second counting unit 140 counts from the first series L1 stored in the first recording unit 120 according to the sequence of [1, 5, 7, 6, 3, 4, 2] similar to the first counting unit 110.

The second counting unit 140 generates a third signal S3 when the second series L2 is counted by the second counting unit 140. Namely, the comparator 150 generates the third signal S3 when the current counting value LOUT output from the second counting unit 140 equals the second series L2 from the first recording unit 120.

The binary counter 160 counts when the second counting unit 140 counts from the first series L1 to the second series L2, and outputs a current counting value BOUT to the second recording unit 170 simultaneously, such as when the second counting unit 140 and the binary counter 160 are initially set to the first series L1 and 0 respectively and count at the same time.

The second recording unit 170 is coupled to the binary counter 160, recording the current counting value BOUT the binary counter 160 to serve as the binary counting value when receiving the third signal S3. For example, the second recording unit 170 can also be implemented by D flip-flops. The binary counting value stored in the second recording unit 170 can be used for ranging function.

The first counting unit 110, the second counting unit 140 and the binary counter 160 are controlled by the clock signals CLK1 and CLK2. For example, the first counting unit 110 can be operated at 4 GHz, the binary counter 160 and the second counting unit 140 can be operated at 1 GHZ. In order to obtain better accuracy, the first counting unit 110 is preferably operated at 4 GHz.

Figure 3A:
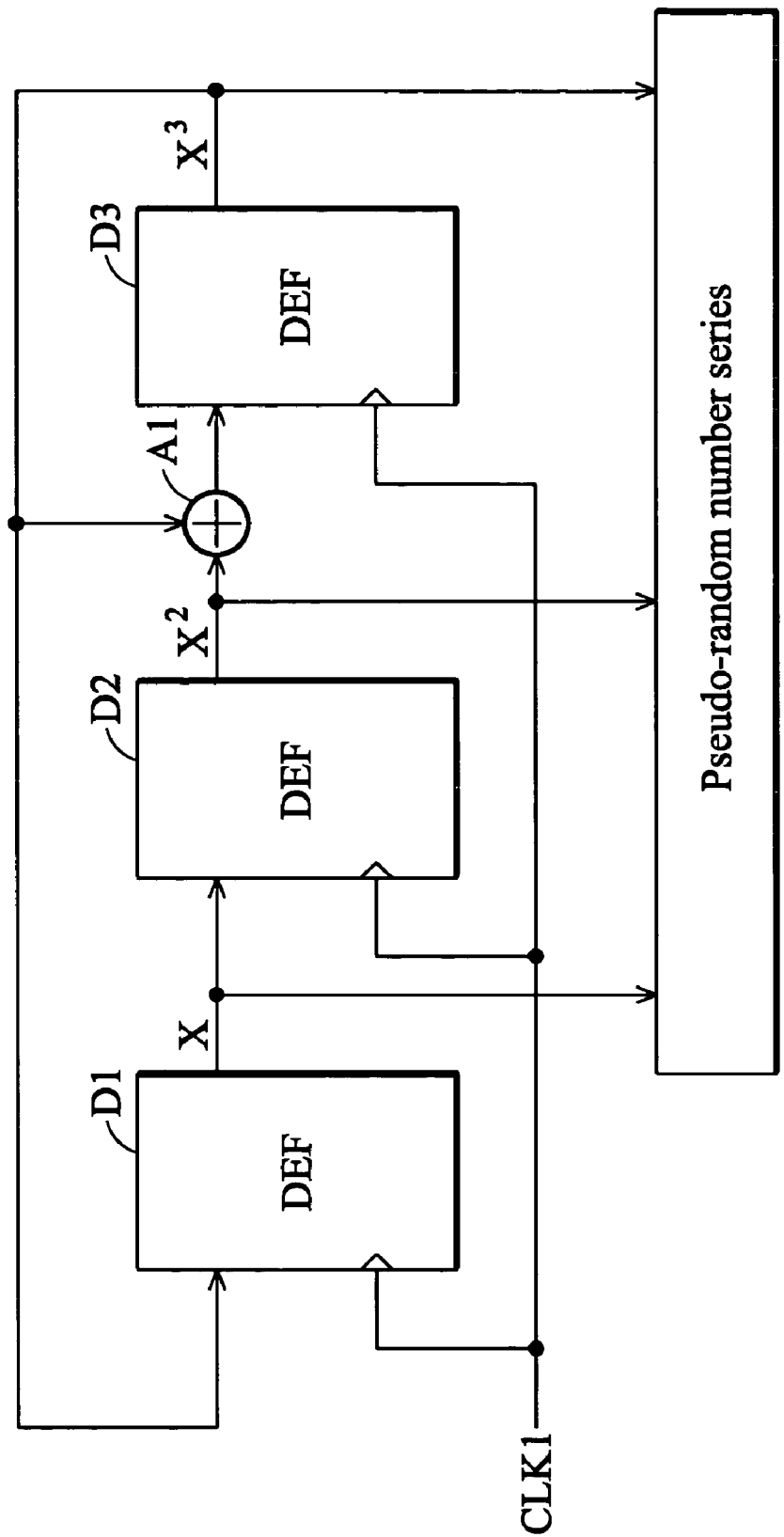
FIG. 3A shows an embodiment of a LFSR counter.

FIG. 3A shows an embodiment of a LFSR counter. As shown, the LFSR counter of 3 bits comprises three D flip-flops D1~D3 and an adder A1 connected in series, the three D flip-flops D1~D3 are controlled by the clock signal CLK1 (4 GHz). In FIG. 3A, $X^1$-$X^3$ denote the outputs of D flip-flops D1, D2 and D3, respectively. For example, the LFSR counter can generate pseudo-random numbers series not including zero, such as "001", "101", "111", "110", "011", "100", "010" and back to "001".

Figure 3B:
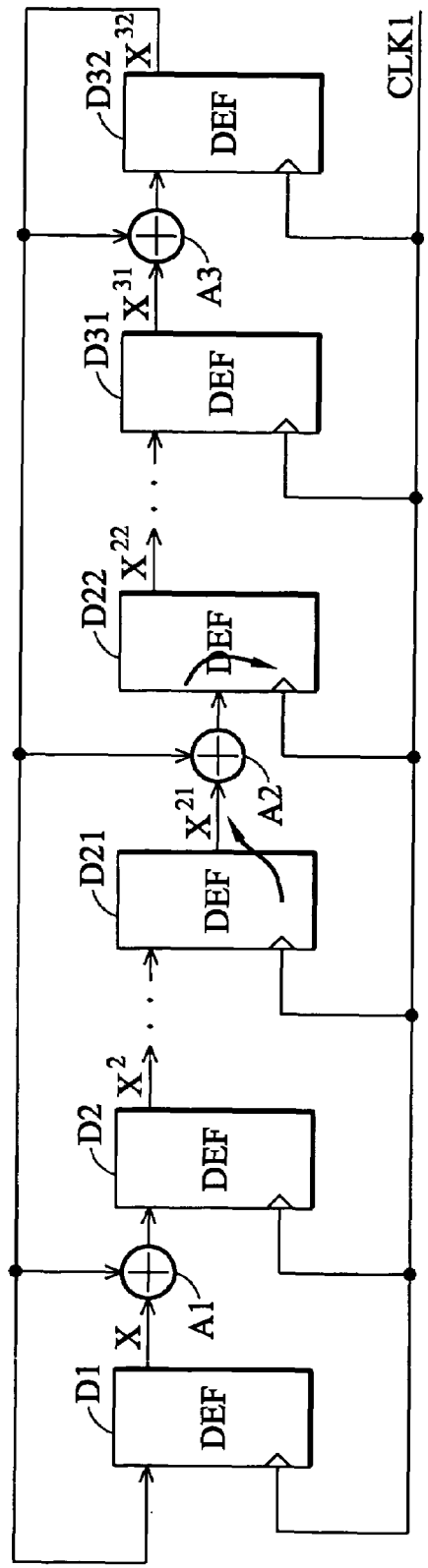
FIG. 3B shows another embodiment of a LFSR counter.

FIG. 3B shows another embodiment of a LFSR counter 300. As shown, the LFSR counter of 32 bits comprises 32 D flip-flops D1~D32 and three adders A1~A3 connected in series, in which all D flip-flops D1~D32 are controlled by the clock signal CLK1 (4 GHz). For example, the LFSR counter can generate pseudo-random numbers series not including zero, in which pseudo-random numbers series comprises 32 bits, consisting of $X^1$-$X^{32}$, the outputs of D flip-flops D1~D32. This 32 bit LFSR counter can serve as the ranging counter required by UWB specification.

TABLE 1

| m | Stage connected to modulo-2 adder |
|---|---|
| 2 | 1, 2 |
| 3 | 1, 3 |
| 4 | 1, 4 |
| 5 | 1, 4 |
| 6 | 1, 6 |
| 7 | 1, 7 |

TABLE 1-continued

| m | Stage connected to modulo-2 adder |
|---|---|
| 8 | 1, 5, 6, 7 |
| 9 | 1, 6 |
| 10 | 1, 8 |
| 11 | 1, 10 |
| 12 | 1, 7, 9, 12 |
| 13 | 1, 10, 11, 13 |
| 14 | 1, 5, 9, 14 |
| 15 | 1, 15 |
| 16 | 1, 5, 14, 16 |
| 17 | 1, 15 |
| 18 | 1, 12 |
| 19 | 1, 15, 18, 19 |
| 20 | 1, 18 |
| 21 | 1, 20 |
| 22 | 1, 22 |
| 23 | 1, 19 |
| 24 | 1, 18, 23, 24 |
| 25 | 1, 23 |
| 26 | 1, 21, 25, 26 |
| 27 | 1, 23, 26, 27 |
| 28 | 1, 26 |
| 29 | 1, 28 |
| 30 | 1, 8, 29, 30 |
| 31 | 1, 29 |
| 32 | 1, 11, 31, 32 |
| 33 | 1, 21 |

While table 1 lists the stages connected to modulo-2 adder that result in a maximum-length shift register for $2 \leq m \leq 33$, to constitute the described non-binary counting unit, it should be understood that the invention is not limited thereto.

Figure 1A:
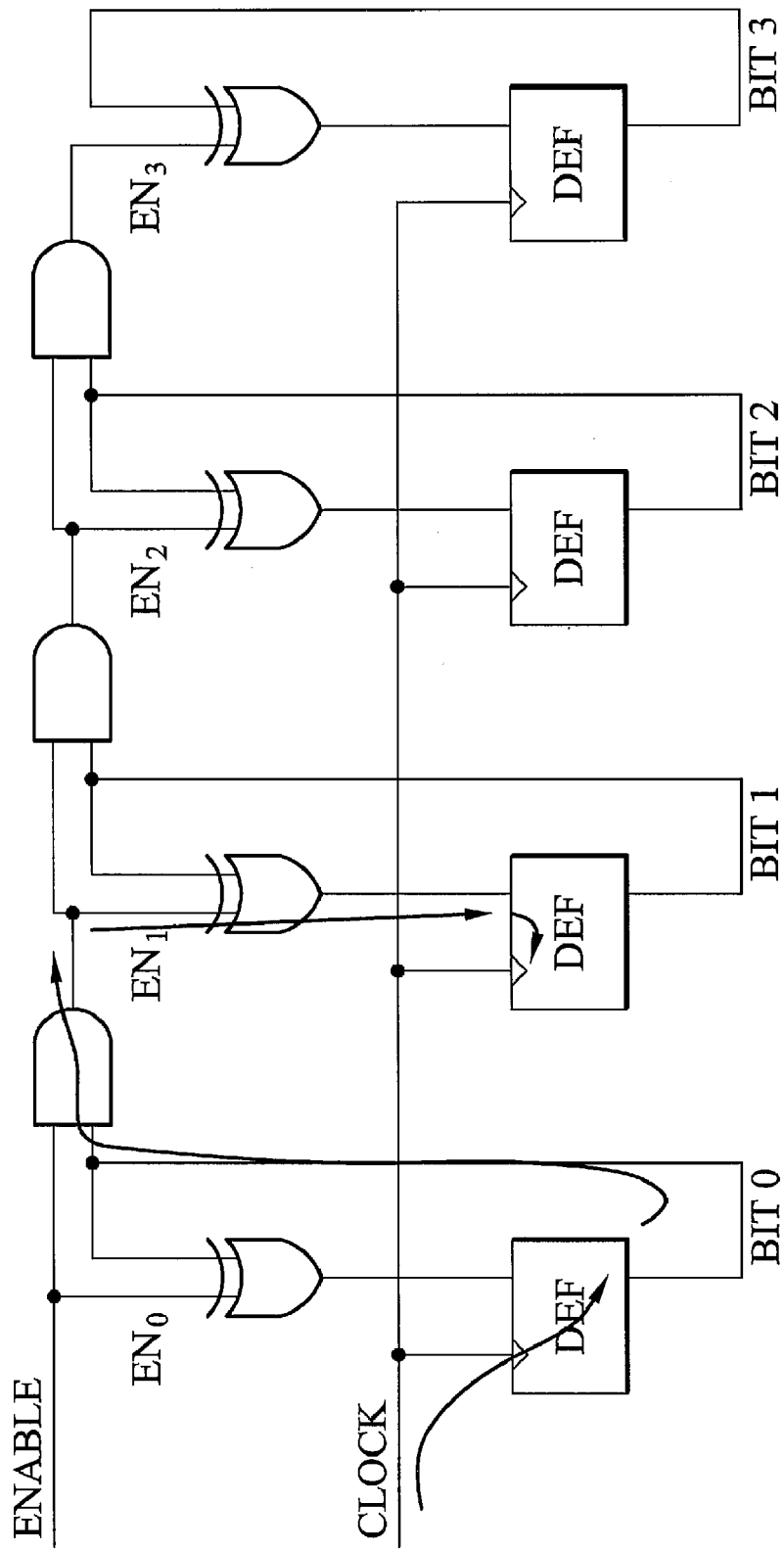
FIGS. 1A and 1B show conventional binary counters.
Figure 1B:
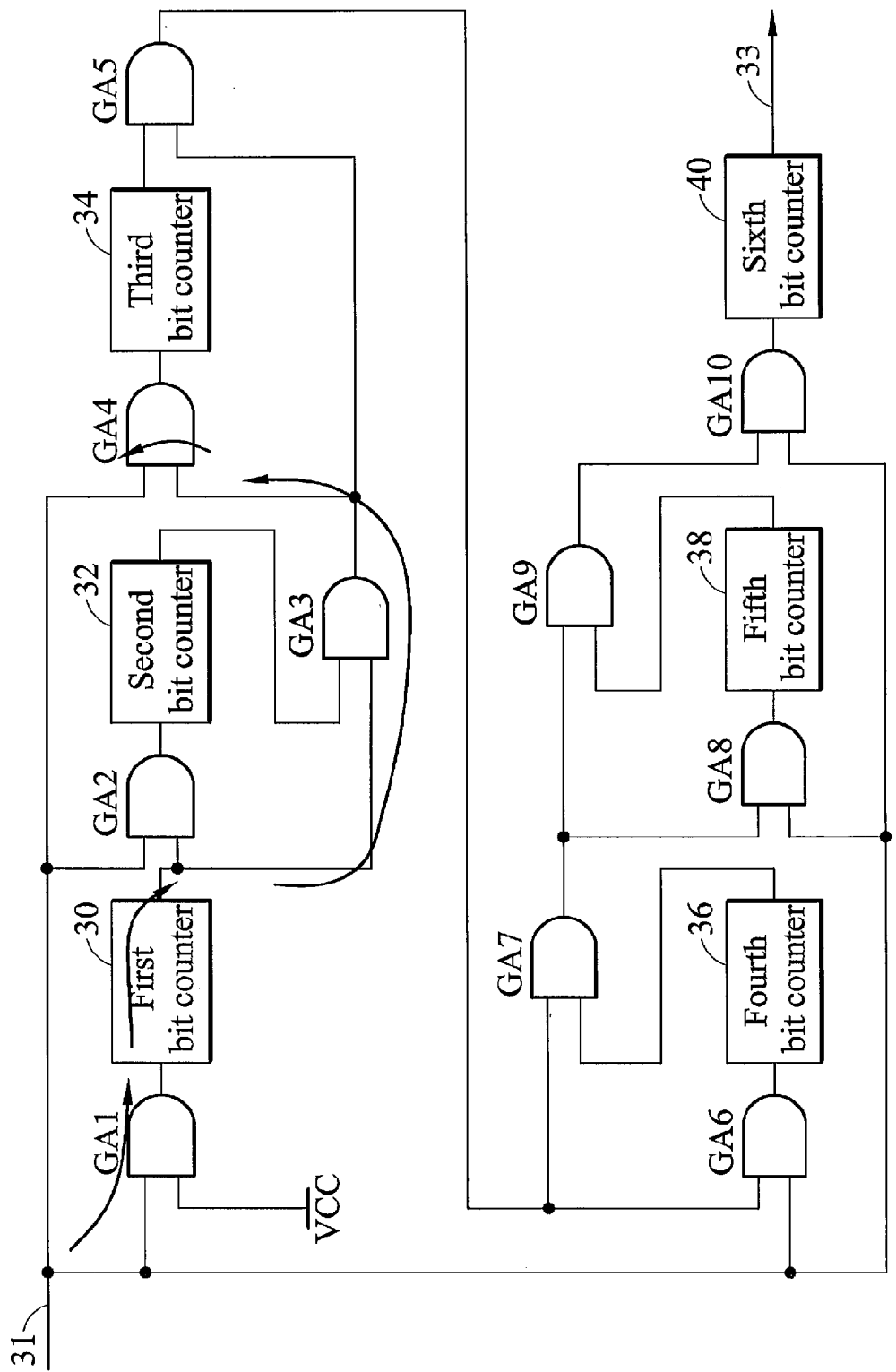

The critical path of the conventional binary counter shown in FIG. 1A comprises CK→Q delay, AND delay, XOR delay and D→CK setup time. The clock rates of the binary counter shown in FIG. 1A implemented by UMC 0.13 um logic process and 90 nm logic process are 2.25 GHz and 3.57 GHz respectively. The critical path of the conventional binary counter shown in FIG. 1B comprises AND delay, CK→Q delay, AND delay, and gated-clock setup time. The clock rates of the binary counter shown in FIG. 1B implemented by UMC 0.13 um logic process and 90 nm logic process are 2.41 GHz and 3.70 GHz respectively.

As shown in FIG. 3B, the critical path of the LFSR counter comprises only CK→Q delay, XOR delay and D→CK setup time. Because the invention utilizes LFSR counters rather than conventional binary counters, critical path of counter can be reduced and clock rate can be increased. The counting circuit 100 of the invention can have clock rates 2.82 GHz and 4.35 GHz respectively, by implemented with UMC 0.13 um logic process and 90 nm logic process. Thus, the clock rate can meet the UWB specification requirement of 4.224 GHz.

Figure 4:
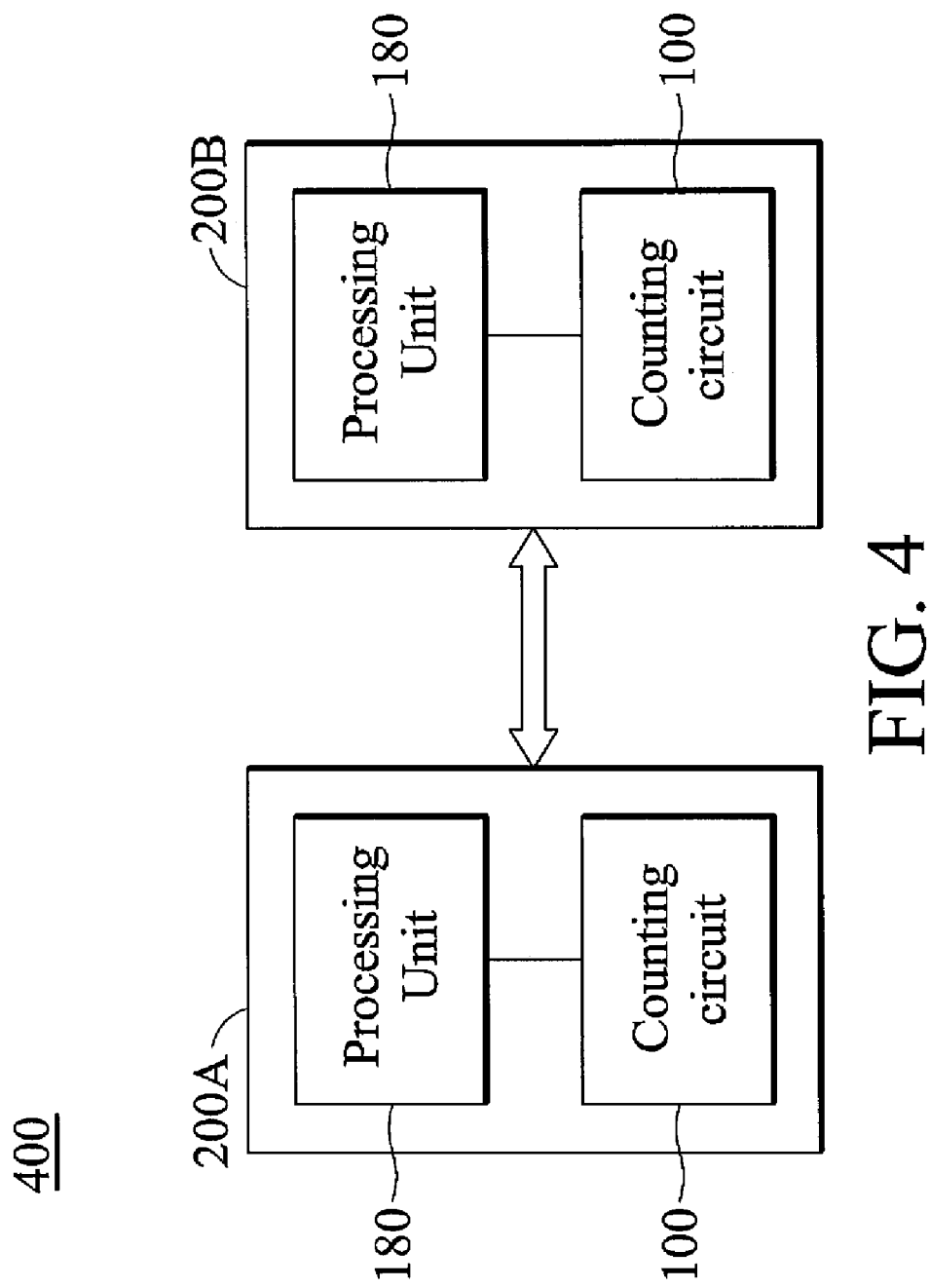
FIG. 4 shows an embodiment of a distance measurement system for ultra wideband (UWB) application.

The invention also discloses an embodiment of a distance measurement system for ultra wideband (UWB) application. As shown in FIG. 4, a distance measurement system 400 comprises a first electronic device 200A and a second electronic device 200B, each comprising a processing unit 180 and the disclosed counting circuit 100. In the devices 200A and 200B, the counting circuits are similar to those shown in FIG. 2 and thus, description thereof is omitted for simplification.

When the device 200A executes a ranging function, the device 200A transmits a ranging signal to the device 200B. At this time, the recording unit 120 in the device 200A records a first series L1 recorded from the sequence of pseudo-random number series generated by the counting unit 110. For example, time at which the device 200A transits the ranging signal can be T1c.

When the device 200B receives the ranging signal from the device 200A, the recording unit 120 therein records a second series L2 from the sequence of pseudo-random number series. For example, time at which the device 200B receives the ranging signal can be R2c.

After receiving the ranging signal, the device 200B transmits a reply signal to the device 200A. At this time, the recording unit 120 in the device 200B records a third series L3 recorded from the sequence of pseudo-random number series generated by the counting unit 110. For example, time at which the device 200B transits the replay signal can be T2c.

When the device 200A receives the reply signal from the device 200B, the recording unit 120 therein records a fourth series L4 from the sequence of pseudo-random number series. For example, time at which the device 200A receives the reply signal can be R1c.

The device 200A generates a first binary counting value according to the stored first series L1 and fourth series L4, by the transfer unit therein. Similarly, the device 200B generates a second binary counting value according to the stored second series L2 and third series L3, by the transfer unit therein, and transmits to the device 200A.

Based on UWB specification, the processing unit 180 in the device 200A can estimate a relative distance D between the devices 200A and 200B according to the first binary counting value, the second binary counting value and the following formulae.

$$D = C \times \left[ \frac{(R2c - T1c) - (T2c - R1c)}{2} \right]$$
$$= C \times \left[ \frac{(R1c - T1c) + (R2c - T2c)}{2} \right]$$

Wherein C is light velocity, time difference R1c–T1c can be obtained by the first binary counting value and time difference R2c–T2c can be obtained by second first binary counting value. For example, the time differences R1c–T1c and R2c–T2c can be obtained according to the binary counting value and the operation frequency of the first counting unit 110.

Because higher clock rate provides improved precision, the ranging function of the UWB electronic device can be improved by the clock rate exceeding 4 GHz provided by the disclosed counting circuits of the invention.

The invention also discloses an embodiment of a distance estimation method for an electronic device.

First, a sequence of pseudo-random number series not including zero is generated to count. For example, the sequence of pseudo-random number series can be generated by a 32 bit LFSR register with max-length polynominal, also referred as a non-binary counter.

A first series L1 is recorded from the sequence generated by the 32 bits LFSR register when a first device 200A transmits a ranging signal to a second device 200B, and a second series L2 is recorded from the sequence when receiving a reply signal from the second device 200B.

Next, a first binary counting value is generated according to the first series L1 and second series L2 by a transfer unit. For example, the first series L1 can be applied to a second LFSR counter and a binary counter set to zero initially. The second LFSR counter and the binary counter start to count at the same time, and the current counting value LOUT of the second LFSR counter is output to a comparator. When the current counting value LOUT of the second LFSR counter meets the second series L2 (the second LFSR counter counting to the second series L2 from the first series L1), the comparator outputs a third signal S3. Then, upon receiving the third signal S3, the current counting value BOUT of the binary counter is recorded by a second recording unit, serving as the first binary counting value.

A relative distance between the first device 200A and the second device 200B is estimated according to the binary counting value and a second binary counting value generated by the second device. Based on UWB specification, the processing unit in the first device 200A can estimate a relative distance D between the two devices 200A and 200B according to the first binary counting value, a second binary counting value and the following formulae.

$$D = C \times \left[ \frac{(R2c - T1c) - (T2c - R1c)}{2} \right]$$
$$= C \times \left[ \frac{(R1c - T1c) + (R2c - T2c)}{2} \right]$$

Wherein C is light velocity, time difference R1c–T1c can be obtained by the first binary counting value and time difference R2c–T2c can be obtained by second first binary counting value. For example, the time differences R1c–T1c and R2c–T2c can be obtained according to the binary counting value and the operation frequency of the first counting unit. It should be noted, according to the first and second series L1 and L2, the binary counting value also can be generated by software, such as C program.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A counting circuit for distance measurement, comprising:
    a first counting unit generating a sequence of pseudo-random number series not including zero;
    a first recording unit recording a first series and a second series from the sequence according to a ranging signal and a reply signal; and
    a transfer unit generating a binary counting value according to the first series and second series from the first recording unit; wherein said binary counting value is used for measuring a distance.

2. The counting circuit as claimed in claim 1, wherein the first counting unit comprises a first linear feedback shift register (LFSR) counter operated at a first operating frequency.

3. The counting circuit as claimed in claim 2, wherein the transfer unit comprises:
    a second counting unit comprising a second LFSR counter coupled to the first recording unit, counting from the first series according to the sequence;
    a comparator coupled to the second LFSR counter generating a third signal when the second LFSR counter counts to the second series from the first series;

a binary counter counting when the second LFSR counter counts from the first series to the second series; and a second recording unit coupled to the comparator and the second LFSR counter, recording a current counting value of the binary counter to serve as the binary counting value when receives the third signal.

4. The counting circuit as claimed in claim 3, wherein the second LFSR counter and the binary counter are operated at a second operation frequency lower than the first operating frequency.

5. The counting circuit as claimed in claim 3, wherein the first and second recording units comprise D flip-flops.

6. A distance measurement system, comprising:
a first electronic device comprising:
a first counting unit to generate a sequence of pseudo-random number series not including zero,
a first recording unit recording a first series and a second series from the first sequence when the first electronic device transmits a ranging signal to a second electronic device and receives a replay signal therefrom respectively; and
a transfer unit generating a first binary counting value according to the first series and second series; wherein a distance between the first and the second electronic devices is estimated according to the first binary counting value and a second binary counting value.

7. The distance measurement system as claimed in claim 6, wherein the second binary counting value is generated by the second electronic device in response to receipt of the ranging signal and transmission of the reply signal.

8. The distance measurement system as claimed in claim 7, wherein the first counting units comprise a first linear feedback shift register (LFSR) counter.

9. The distance measurement system as claimed in claim 8, wherein the first transfer unit comprises:
a second counting unit comprising a second LFSR counter coupled to the first recording unit, counting from the first series according to the sequence;
a first comparator coupled to the second LFSR counter generating a third signal when the second LFSR counter counts to the second series from the first series;
a binary counter counting when the second LFSR counter counts from the first series to the second series; and
a second recording unit coupled to the comparator and the second LFSR counter, recording a current counting value of the binary counter to serve as the first binary counting value when receives the third signal.

10. The distance measurement system as claimed in claim 9, the second LFSR counter and the binary counter are operated at a second operating frequency lower than the first operating frequency.

11. The distance measurement system as claimed in claim 9, wherein the first and second recording units comprise D flip-flops.

12. A distance estimation method for an electronic device, comprising:
generating a sequence of pseudo-random number series not including zero to count;
recording a first series from the sequence when transmitting a ranging signal to a detected device;
recording a second series from the sequence when receiving a reply signal from the detected device;
generating a first binary counting value according to the first series and second series; and
estimating a distance between the electronic device and the detected device according to the first binary counting value and a second binary counting value generated by the detected device.

13. The distance estimation method as claimed in claim 12, wherein the sequence of pseudo-random number series is generated by a first linear feedback shift register (LFSR) counter.

14. The distance estimation method as claimed in claim 13, generation of the first binary counting value comprising:
counting from the first series according to the sequence by a second LFSR counter and counting by a binary counter simultaneously;
generating a third signal when the second LFSR counter counts to the second series according to the sequence; and
recording a current counting value of the binary counter to serve as the first binary counting value when receiving the third signal.

15. The distance estimation method as claimed in claim 12, wherein the second binary counting value is generated by the second electronic device in response to receipt of the ranging signal and transmission of the reply signal.

16. The distance estimation method as claimed in claim 12, comprising:
providing a counting unit to generate the sequence.

17. The distance estimation method as claimed in claim 12, comprising:
transmitting the ranging signal to a detected device before recording the first series; and
receiving the reply signal from the detected device before recording the second series.

* * * * *